United States Patent
Ban et al.

(10) Patent No.: US 11,001,461 B2
(45) Date of Patent: May 11, 2021

(54) COMPONENT MOUNTING APPARATUS

(71) Applicant: HANWHA PRECISION MACHINERY CO., LTD., Changwon-si (KR)

(72) Inventors: Jong Eok Ban, Changwon-si (KR); Byung Ju Kim, Changwon-si (KR); Sung Ho Jo, Changwon-si (KR); Eun Suk Yoon, Changwon-si (KR)

(73) Assignee: HANWHA PRECISION MACHINERY CO., LTD., Changwon-si (KR)

( * ) Notice: Subject to any disclaimer, the term of this patent is extended or adjusted under 35 U.S.C. 154(b) by 0 days.

(21) Appl. No.: 16/399,063

(22) Filed: Apr. 30, 2019

(65) Prior Publication Data

US 2019/0344982 A1 Nov. 14, 2019

(30) Foreign Application Priority Data

May 9, 2018 (KR) .......................... 10-2018-0053197

(51) Int. Cl.
*B65G 69/00* (2006.01)
*G02B 5/20* (2006.01)
(Continued)

(52) U.S. Cl.
CPC ............. *B65G 69/00* (2013.01); *B65G 15/58* (2013.01); *G02B 5/08* (2013.01); *G02B 5/208* (2013.01);
(Continued)

(58) Field of Classification Search
CPC .... B65G 69/00; B65G 15/58; B65G 2811/06; H04N 5/33; H04N 5/2253; G02B 5/08;
(Continued)

(56) References Cited

U.S. PATENT DOCUMENTS 4,608,494 A * 8/1986 Kobayashi ............ H01L 21/681
250/461.1
4,672,209 A * 6/1987 Karasaki ............ H05K 13/0815
250/458.1
(Continued)

FOREIGN PATENT DOCUMENTS

JP 6-132697 A 5/1994
JP 2003-124700 A 4/2003
(Continued)

OTHER PUBLICATIONS

Communication dated Nov. 20, 2020 by the Korean Intellectual Property Office in counterpart Korean Patent Application No. 10-2018-0053197.

*Primary Examiner* — William R Harp
(74) *Attorney, Agent, or Firm* — Sughrue Mion, PLLC

(57) ABSTRACT

A component mounting apparatus includes a component mounting unit including a suction configured to adsorb and transport a component; a first light source configured to emit first light to the component; a second light source configured to emit second light to a Fiducial mark of a substrate; a filter configured to transmit the first light reflected by the component through the filter and reflect the second light reflected by the Fiducial mark; and an image capturer configured to detect the first light transmitted through the filter and the second light reflected by the filter.

9 Claims, 4 Drawing Sheets

(51) Int. Cl.
  *G02B 5/08* (2006.01)
  *H04N 5/225* (2006.01)
  *B65G 15/58* (2006.01)
  *H04N 5/33* (2006.01)

(52) U.S. Cl.
  CPC ............. *H04N 5/2253* (2013.01); *H04N 5/33* (2013.01); *B65G 2811/06* (2013.01)

(58) Field of Classification Search
  CPC .......... G02B 5/208; H01L 2224/75753; H01L 21/6838; H01L 21/681; H01L 21/67144; H01L 24/75; H05K 13/0409; H05K 13/0403; H05K 13/08; H05K 13/0812; H05K 13/0813; H05K 13/0815
  See application file for complete search history.

(56) References Cited

U.S. PATENT DOCUMENTS

| | | | | |
|---|---|---|---|---|
| 5,195,234 A | * | 3/1993 | Pine | ........................ B25J 9/1697 29/720 |
| 7,941,913 B2 | * | 5/2011 | Horijon | ................. H01L 21/681 29/739 |

FOREIGN PATENT DOCUMENTS

| | | |
|---|---|---|
| JP | 2011-9655 A | 1/2011 |
| JP | 2016-9848 A | 1/2016 |
| KR | 10-1038496 B1 | 6/2011 |
| KR | 10-1050840 B1 | 7/2011 |
| KR | 10-1164592 B1 | 7/2012 |
| KR | 10-2012-0101866 A | 9/2012 |

\* cited by examiner

→ FIRST LIGHT
--→ SECOND LIGHT

COMPONENT MOUNTING APPARATUS

CROSS-REFERENCE TO THE RELATED APPLICATION

This application claims priority under 35 U.S.C § 119 to Korean Patent Application No. 10-2018-0053197, filed on May 9, 2018, in the Korean Intellectual Property Office, the disclosure of which is incorporated herein by reference in its entirety.

BACKGROUND

1. Field

Apparatuses consistent with exemplary embodiments relate to an apparatus, and more particularly, to a component mounting apparatus.

2. Description of the Related Art

A component mounting apparatus is an apparatus which is capable of placing a component on a substrate and also capable of mounting the component on the substrate. It is very important for such a component mounting apparatus to place and mount a component at a precise position of a substrate. When the component mounting apparatus fails to precisely mount a component on a substrate, the component may not operate properly or may get damaged during the mounting.

To improve the accuracy of the placement of the component, a component mounting apparatus may assess a position and an orientation of a substrate as well as a position and an orientation of a component to be mounted to the substrate. In this case, a component mounting apparatus of the related art may include a camera for determining a position and an orientation of a substrate separately from a camera for measuring a position and an orientation of a component.

In the related art, the positions of the cameras are typically fixed, and a position and an orientation of at least one of a component or a substrate may be determined based on images captured by the cameras. Accordingly, the position and orientation of the component may be adjusted and the component may be mounted on the substrate after the adjustment.

SUMMARY

One or more exemplary embodiments provide a component mounting apparatus.

Additional aspects will be set forth in part in the description which follows and, in part, will be apparent from the description, or may be learned by practice of the presented exemplary embodiments.

According to an aspect of an exemplary embodiment, there is provided a component mounting apparatus including a component mounting unit including a suction configured to adsorb and transport a component; a first light source configured to emit first light to the component; a second light source configured to emit second light to a Fiducial mark of a substrate; a filter configured to transmit the first light reflected by the component through the filter and reflect the second light reflected by the Fiducial mark; and an image capturer configured to detect the first light transmitted through the filter and the second light reflected by the filter.

The first light may be infrared radiation or ultraviolet radiation.

The second light may be visible light.

The second light may be monochromatic.

The component mounting apparatus may further include a first light guide configured to reflect the first light at least once and configured to guide the first light to the filter.

The component mounting apparatus may further include a second light guide configured to refract the second light and configured to guide the second light to the filter.

A portion of the first light reflected by the Fiducial mark may be transmitted through the filter.

A portion of the second light reflected by the component may be reflected by the filter.

BRIEF DESCRIPTION OF THE DRAWINGS

The above and/or other aspects of the disclosure will become apparent and more readily appreciated from the following description of the exemplary embodiments, taken in conjunction with the accompanying drawings in which.

DETAILED DESCRIPTION

Figure 1:
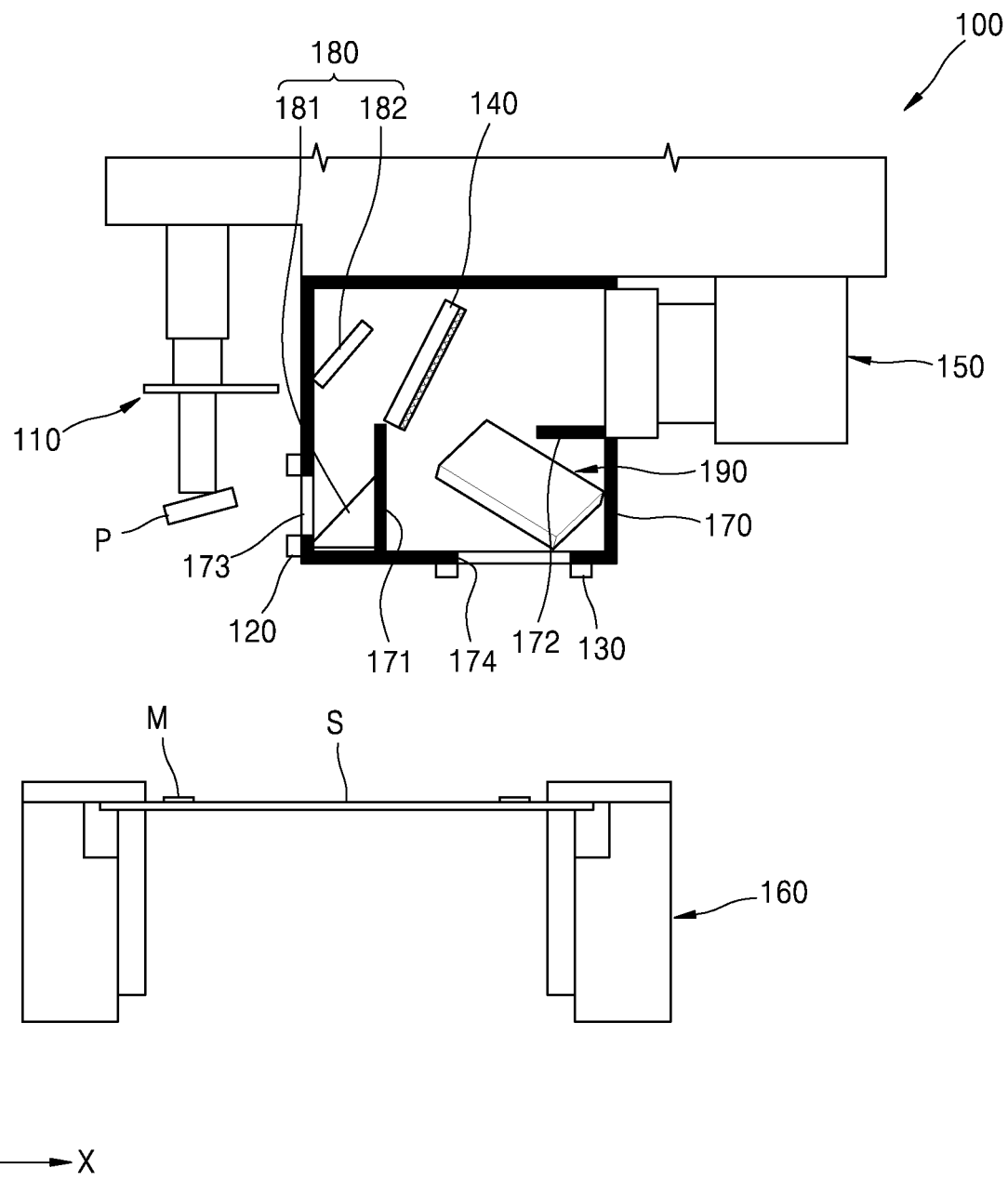
FIG. 1 is a conceptual view of a component mounting apparatus according to an exemplary embodiment.

Reference will now be made in detail to exemplary embodiments, examples of which are illustrated in the accompanying drawings, wherein like reference numerals refer to like elements throughout. In this regard, the exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

The effects and features of the disclosure and the accompanying methods thereof will become apparent from the following description of the exemplary embodiments, taken in conjunction with the accompanying drawings. Hereinafter, the present invention will be described more fully with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure will be thorough and complete, and will fully convey the scope of the invention to one of ordinary skill in the art. The terms used in the present specification are merely used to describe particular exemplary embodiments, and are not intended to limit the present invention. An expression used in the singular encompasses the expression of the plural, unless it has a clearly different meaning in the context. In the present specification, it is to be understood that the terms such as "comprises" and/or "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added. While such terms as "first," "second," etc., may be used to describe various elements, such elements must not be limited to the above terms. The above terms may be used only to distinguish one element from another.

Figure 2:
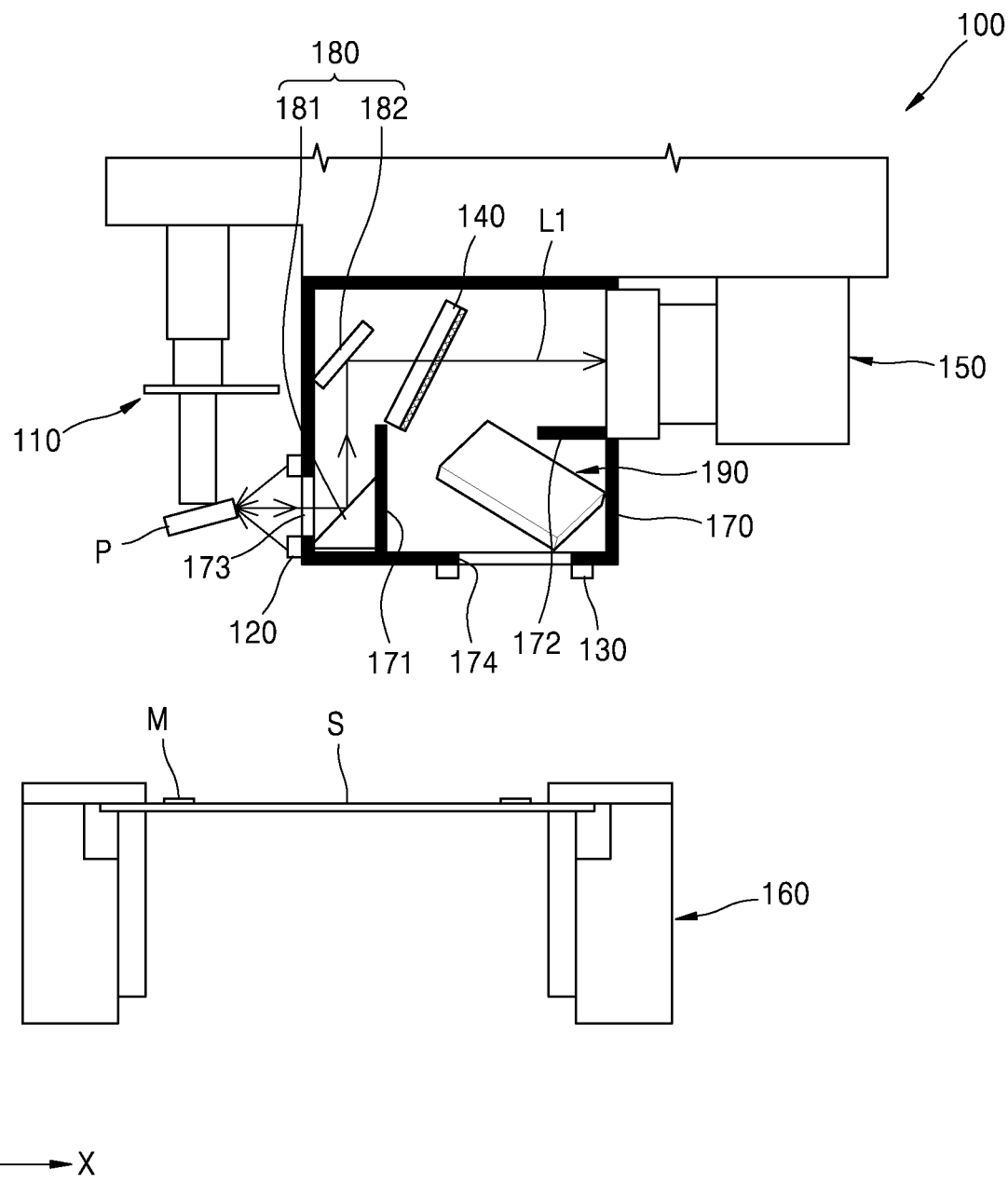
FIG. 2 is a front-view diagram showing an operation state of the component mounting apparatus shown in FIG. 1 according to an exemplary embodiment.
Figure 3:
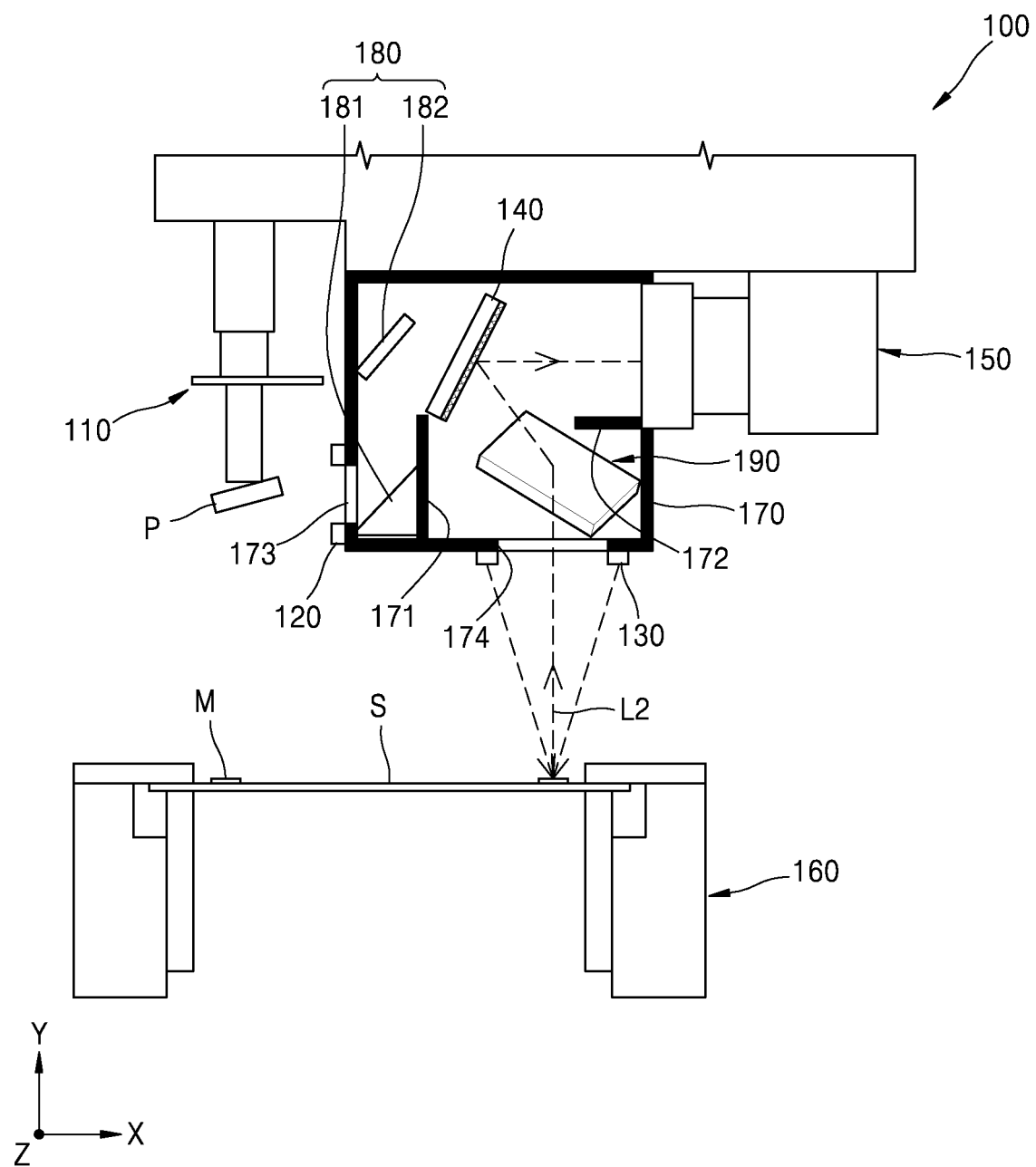
FIG. 3 is a front-view diagram showing an operation state of the component mounting apparatus shown in FIG. 1 according to an exemplary embodiment.

FIG. 1 is a conceptual view of a component mounting apparatus 100 according to an exemplary embodiment. FIG. 2 is a front-view diagram showing an operation state of the component mounting apparatus 100 shown in FIG. 1 according to an exemplary embodiment. FIG. 3 is a front-view diagram showing an operation state of the component mounting apparatus 100 shown in FIG. 1 according to an exemplary embodiment.

Referring to FIGS. 1 to 3, a component mounting apparatus 100 may include a component mounting unit 110, a first light source 120, a second light source 130, a filter unit 140, an image capturing unit 150, a substrate mounting unit 160, a casing 170, a first light guide 180, and a second light guide 190.

The component mounting unit 110 may pick up a component P and mount the component P on a substrate S. In the exemplary embodiment, the component mounting unit 110 may include a suction nozzle (not shown) for suctioning the component P. The component mounting unit 110 may perform a rotating motion, a linear movement, etc. to not only transport the component P, but also mount the component P on the substrate S. Also, the component mounting unit 110 may heat the component P to fix the component P onto the substrate S. The component mounting unit 110 may be connected to a driving unit (e.g., a motor) or include such a driving unit for performing at least one of the rotating motion and the linear motion.

At least one first light source 120 (also may be referred as a first light source 120) may be provided. In the exemplary embodiment, the first light source 120 may be arranged to not overlap with the path of first light L1 (FIG. 2) incident on the filter unit 140 after the first light L1 is reflected by the component P. When a plurality of first light sources 120 are provided, the plurality of first light sources 120 may be arranged in a circular pattern, and the first light L1 may pass through the center of the plurality of first light sources 120 after the first light L1 collides and is reflected by the component P.

At least one second light source 130 (also may be referred as a second light source 130) may be arranged at a different location from the first light source 120 to irradiate second light L2 to the substrate S. In the exemplary embodiment, the second light source 130 may be arranged to not overlap with the path of second light L2 (FIG. 3) incident on the filter unit 140 after the second light L2 is irradiated to the substrate S. Particularly, when a plurality of second light sources 130 are provided, the plurality of second light sources 130 may be arranged in a circular pattern to provide a path that the second light L2 travels.

The first light source 120 and the second light source 130 may emit different light to the exterior. For example, the first light source 120 may emit the first light L1, which is an infrared ray or an ultraviolet ray, to the component P. Also, the second light L2 emitted by the second light source 130 may include visible rays, e.g., a blue ray, a red ray, etc. In the exemplary embodiment, the second light L2 may have a single color. When the light emitted from the first light source 120 and the light emitted from the second light source 130 are different from each other, colors of an image captured by the image capturing unit 150 may be clearly distinguished. In the exemplary embodiment, it is possible to clearly distinguish between an image of the component P and an image of the substrate S according to the color of an image captured by the image capturing unit 150.

The filter unit 140 may transmit either one of the first light L1 or the second light L2 therethrough and may reflect and refract the other one of the first light L1 or the second light L2. In the exemplary embodiment, the filter unit 140 may include a diachronic filter for transmitting only light of a specific wavelength therethrough. Hereinafter, for convenience of explanation, descriptions will be given in relation to a case where the filter unit 140 may transmit the first light L1 therethrough and may not transmit the second light L2 therethrough and reflect the second light L2.

The image capturing unit 150 may capture images of Fiducial marks M of the component P and the substrate S through the first light L1 transmitted through the filter unit 140 and the reflected second light L2. In the exemplary embodiment, the image capturing unit 150 may be disposed to face a side surface of the component P. The image capturing unit 150 may include a camera. The image capturing unit 150 may be arranged at a height different from that of a side surface of the component P. Accordingly, the image capturing unit 150 may capture videos or images according to the first light L1 and the second light L2 without interference.

The substrate S may be mounted and fixed onto the substrate mounting unit 160, and the substrate mounting unit 160 may also transport the substrate S. The substrate mounting unit 160 may include a structure and a mechanism for fixing the substrate S and may include a conveyor or the like to transport the substrate S.

The casing 170 may have a space (a chamber) formed therein. Furthermore, the casing 170 may provide paths that the first light L1 and the second light L2 travel by blocking the external light. In the exemplary embodiment, the casing 170 may have an outer surface of a non-transparent material or an impermeable color to prevent introduction of light from the exterior. The casing 170 may include a hole 174, such that the first light L1 and the second light L2 are incident thereinto. In the exemplary embodiment, a separate transparent window 173 may be provided in the hole 174 or the hole 174 may be maintained open without a separate member. The first light source 120 or the second light source 130 may be disposed around the hole 174 or the transparent window 173. Hereinafter, descriptions will be given in relation to a case where the transparent window 173 is disposed in the hole 174 for convenience of explanation.

The casing 170 may include a first partitioning wall 171 blocking the first light L1 and a second partitioning wall 172 blocking the second light L2. In the exemplary embodiment, the first partitioning wall 171 may block the first light L1 which is reflected by a side surface of the component P and travels straight. Also, the second partitioning wall 172 may prevent the second light L2 reflected by the Fiducial mark M of the substrate S from entering into the image capturing unit 150.

The first light guide 180 may change the path of the first light L1 reflected by the component P. For example, the first light guide 180 may reflect the first light L1, which is reflected by the component P, in a first direction and reflect the first light L1 incident in the first direction in a second direction different from the first direction, such that the first light L1 is incident on the filter unit 140. The first light guide 180 may include a first mirror 181 reflecting the first light L1 in the first direction and a second mirror 182 reflecting the first light L1 reflected by the first mirror 181 in the second direction (different from the first direction).

The second light guide 190 may reflect or refract the second light L2 reflected by the Fiducial mark M of the substrate S. At this time, the second light guide 190 may guide the second light L2 to the filter unit 140.

The first light guide 180 and the second light guide 190 may prevent the first light L1 and the second light L2 incident on the filter unit 140 from overlapping with each other.

Hereinafter, the operation of the component mounting apparatus 100 will be described in detail.

When the component mounting apparatus 100 is operated, the degree of misalignment of the component P may be measured. In detail, when the first light L1 is emitted from the first light source 120, the first light L1 may be irradiated from the first light source 120 to the component P. Thereafter, the reflected first light L1 that collides with and is reflected by the component P may travel into a casing 170. At this time, in the casing 170, the first light L1 may collide with the first mirror 181 and be reflected thereby. In the exemplary embodiment, the traveling direction of the first light L1 may be changed as the first light L1 is reflected by the first mirror 181, and the first light L1 may travel in the first direction (e.g., the Y direction in FIG. 2). The first light L1 may be transmitted toward the second mirror 182 by the first mirror 181. The second mirror 182 may reflect the first light L1 traveling in the first direction in the second direction (e.g., the X direction in FIG. 2). In the exemplary embodiment, the first direction and the second direction may be directions different from each other. The first light L1 traveling as described above may be incident on the filter unit 140. The filter unit 140 may transmit the first light L1 therethrough. The first partitioning wall 171 may be arranged perpendicular to the substrate S to block a part of the first light L1. In the exemplary embodiment, the first partitioning wall 171 may prevent an image of the component P from blurring in the image capturing unit 150 due to a part of the first light L1.

The first light L1 transmitted through the filter unit 140 may enter into the image capturing unit 150. The image capturing unit 150 may detect the state of the component P by capturing an image of the first light L1.

When the component mounting apparatus 100 detects the position of the substrate S, the second light source 130 may irradiate the second light L2 onto the Fiducial mark M of the substrate S. The second light L2 may be incident on the Fiducial mark M, be reflected thereby, and enter the casing 170. At this time, the second light guide 190 may refract the second light L2 and guide the second light L2 to the filter unit 140.

In the exemplary embodiment, the filter unit 140 may not transmit the second light L2 therethrough and may reflect the second light L2. The second light L2 may collide with the filter unit 140, be reflected thereby, and enter the image capturing unit 150.

The image capturing unit 150 may capture images of the substrate S and the Fiducial mark M in the same manner as described above. In the exemplary embodiment, the second partitioning wall 172 may prevent the second light L2 emitted from the second light source 130 from directly entering the image capturing unit 150. The second partitioning wall 172 may be arranged to be parallel to the substrate S.

Hereinafter, a method of operating the component mounting apparatus 100 will be described in detail.

The component mounting apparatus 100 may pick up the component P and mount the component P on the substrate S. At this time, the component mounting apparatus 100 may detect the position of the substrate S and the orientation of the substrate S. In detail, as described above with reference to FIG. 3, when the second light L2 is irradiated from the second light source 130 to the Fiducial mark M, the second light L2 reflected by the Fiducial mark M may be refracted by the second light guide 190. The refracted second light L2 may be reflected by the filter unit 140 and incident on the image capturing unit 150.

The position and the orientation of the substrate S may be determined through the second light L2 incident on the image capturing unit 150. The component mounting apparatus 100 may include a separate control unit (not shown) to determine the position and orientation of the substrate S based on an image captured by the image capturing unit 150.

After the position and the orientation of the substrate S are determined as described above, the position of the component mounting unit 110 may be adjusted according to the position and the orientation of the substrate S. For example, the controller may determine the position and the orientation of the substrate S by comparing a pre-set position and a pre-set orientation of the substrate S with those of the substrate S in the image captured by the image capturing unit 150. Next, the position of the component mounting unit 110 may be changed as much as differences between the pre-set position and the pre-set orientation of the substrate S and the position and the orientation of the substrate S in the image captured by the image capturing unit 150.

It is also possible to measure the position and the orientation of the component P before or after the above-described process is completed. For example, after the first light L1 is irradiated from the first light source 120 to the component P, the first light L1 reflected thereby may be refracted as described above in FIG. 2 and transmitted through the filter unit 140, and then an image of the first light L1 may be captured by the image capturing unit 150. The component mounting unit 110 may be adjusted by comparing the pre-set position and the pre-set orientation of the component P with those of the component P in the image captured by the image capturing unit 150. In this case, the component mounting unit 110 may compare the position and the orientation of the component P with the pre-set position and the pre-set orientation of the component P and adjust the position and the orientation of the component P by adjusting suction force for suctioning the component P or rotating. Also, the control unit may adjust the position of the component mounting unit 110 based on the position and orientation of the substrate S and the position and the orientation of the component P measured as described above.

The control unit may control the motion of the component mounting unit 110 to place the component P onto the substrate S and mount the component P on the substrate S based on the above results.

Therefore, the component mounting apparatus 100 may detect the position and the orientation of the substrate S as well as the position and the orientation of the component P through a single image capturing unit 150. The component mounting apparatus 100 may obtain clear images by detecting the position and the orientation of the component P and the position and the orientation of the substrate S without an interference therebetween, and thus the position and the orientation of the component P and the position and the orientation of the substrate S may be detected accurately.

The component mounting apparatus 100 may minimize structures for measuring the position and the orientation of the component P and the position and the orientation of the substrate S, and thus the volume of the component mounting apparatus 100 itself may be minimized.

The component mounting apparatus 100 may accurately measure the position and the orientation of the component P and the position and the orientation of the substrate S, and thus the component P may be mounted at a correct position of the substrate S.

Figure 4:
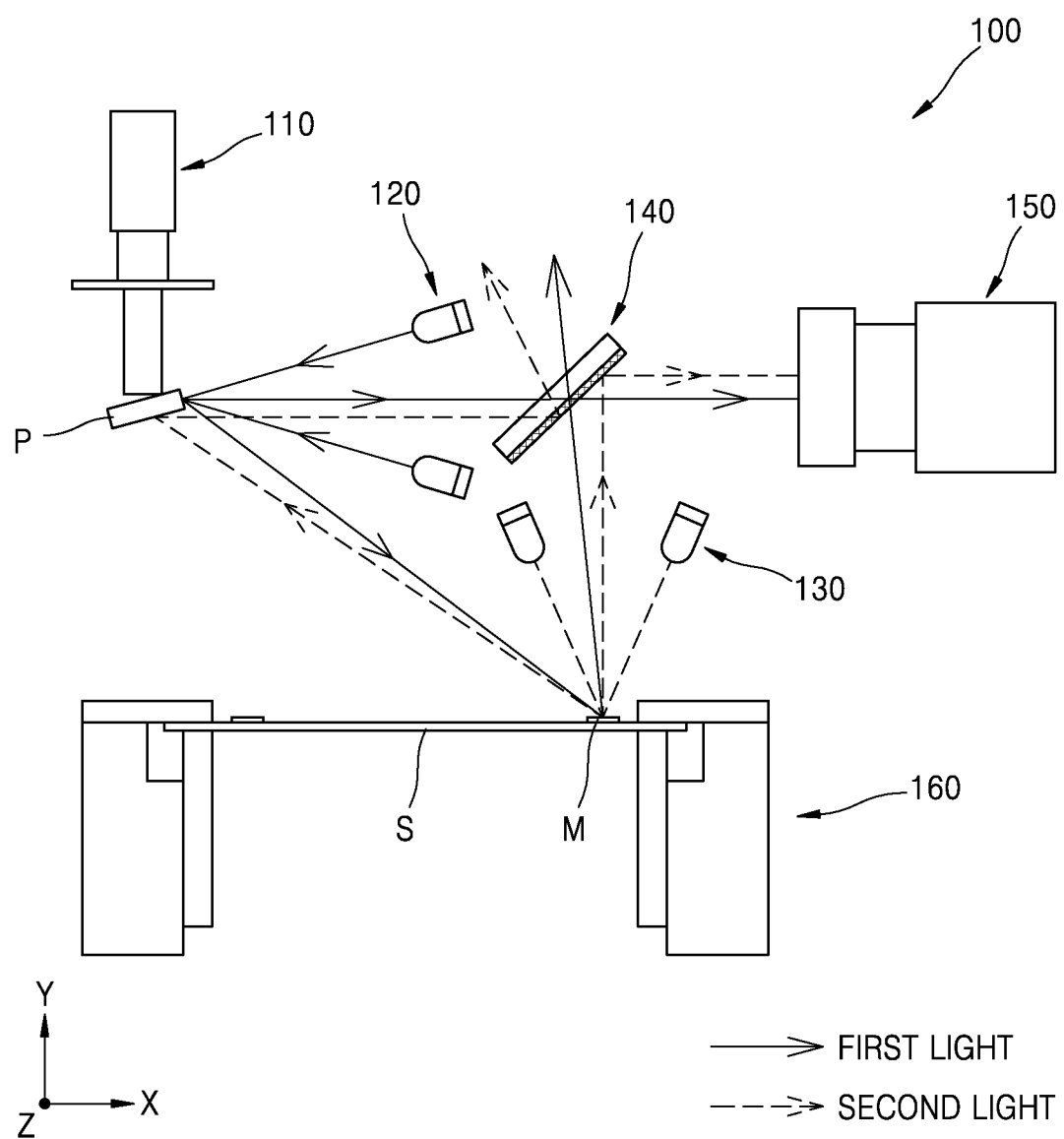
FIG. 4 is a conceptual view illustrating paths of first light and second light according to operating states of the component mounting apparatus shown in FIG. 1 according to an exemplary embodiment.

FIG. 4 is a conceptual view of paths of first light and second light according to operating states of the component mounting apparatus shown in FIG. 1 according to an exemplary embodiment.

Referring to FIG. 4, the first light L1 and the second light L2 described above may be transmitted through the filter unit 140 or refracted/reflected by the filter unit 140, respectively, as described above.

For example, although not shown in FIG. 4, when the first light L1 is emitted from the first light source 120, as shown in FIGS. 1 to 3, the first light L1 may collide with the component P, deflected by a first light guide (not shown), and transmitted to the filter unit 140. This first light L1 may pass through the filter unit 140. On the other hand, a part of the first light L1 emitted from the first light source 120 may be transmitted to the Fiducial mark M and, after the first light L1 collides with the Fiducial mark M, the first light L1 may be transmitted to the filter unit 140 through a second light guide (not shown) as shown in FIGS. 1 to 3. In this case, the part of the first light L1 incident on the filter unit 140 passes through the filter unit 140 and travels to the upper side of the filter unit 140, and thus the first light L1 colliding with the Fiducial mark M may not be incident on the image capturing unit 150.

As described above with reference to FIGS. 1 to 3, the second light L2 may collide with the Fiducial mark M, may be refracted by the second light guide 190, and may enter the filter unit 140. At this time, the second light L2 may be refracted by the filter unit 140 and incident on the image capturing unit 150. On the other hand, a part of the second light L2 emitted from the second light source 130 may travel toward the component P, collide with the component P, and enter the first light guide as shown in FIGS. 1 to 3. Thereafter, the part of the second light L2 that enter the first light guide may be incident on the filter unit 140 or may also be reflected by the filter unit 140.

In the exemplary embodiment, it is possible to prevent an image of the Fiducial mark M from being captured by the image capturing unit 150 through the first light L1 emitted from the first light source 120. Also, it is possible to prevent an image of the component P from being captured by the image capturing unit 150 through the second light L2 emitted from the second light source 130.

Therefore, the component mounting apparatus 100 may capture precise and accurate images by capturing the images of the Fiducial mark M or the component P through only one image capturing unit 150 and a single light source. Particularly, in case of capturing an image of any one of the Fiducial mark M and the component P, the component mounting apparatus 100 may not capture an image of the other one of the Fiducial mark M and the component P, thereby preventing an image of the Fiducial mark M and an image of the component P from overlapping with each other.

According to one or more exemplary embodiments, an image of a Fiducial mark and an image of a component may be captured by using a single image capturing unit.

According to one or more exemplary embodiments, the position and orientation of at least one of a component and a substrate may be accurately measured.

According to one or more exemplary embodiments, a position for mounting a component on a substrate may be accurately determined based on the position and orientation of at least one of the component and the substrate and the component may be precisely mounted on a substrate.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While exemplary embodiments have been described with reference to the figures, it will be understood by those of ordinary skill in the art that various changes in form and details may be made therein without departing from the spirit and scope of the disclosure as defined by the following claims.

What is claimed is:

1. A component mounting apparatus comprising:
a component mounting unit configured to suck and transport a component;
a first light source configured to emit first light to the component;
a second light source configured to emit second light to a Fiducial mark of a substrate;
a filter configured to transmit the first light reflected by the component through the filter, and refract the second light reflected by the Fiducial mark; and
an image capturer configured to detect the first light transmitted through the filter and the second light refracted by the filter,
wherein the first light source is configured to emit the first light to a side surface of the component.

2. The component mounting apparatus of claim 1, wherein the first light comprises infrared radiation or ultraviolet radiation.

3. The component mounting apparatus of claim 1, wherein the second light is visible light.

4. The component mounting apparatus of claim 3, wherein the second light is monochromatic.

5. The component mounting apparatus of claim 1 further comprising a first light guide configured to refract the first light at least once, and configured to guide the first light to the filter.

6. The component mounting apparatus of claim 1, further comprising a casing that has a space therein that includes the filter, wherein
the first light source and the second light source emit the first light and the second light, respectively, away from the casing.

7. The component mounting apparatus of claim 6, wherein
the casing comprises a first hole and a second hole, the first hole configured to introduce the first light reflected by the component into the casing, and the second hole configured to introduce the second light reflected by the Fiducial mark into the casing,
the first light source comprises a plurality of first light sources that are arranged in a circular pattern around the first hole, and the second light source comprises a plurality of second light sources that are arranged in a circular pattern around the second hole.

8. A component mounting apparatus comprising:
a component mounting unit configured to such and transport a component;
a first light source configured to emit first light to the component;
a second light source configured to emit second light to a Fiducial mark of a substrate;
a filter configured to transmit the first light reflected by the component through the filter, and reflect the second light reflected by the Fiducial mark;
an image capturer configured to detect the first light transmitted through the filter and the second light refracted by the filter, and
a second light guide configured to refract the second light, and configured to guide the second light to the filter.

9. A component mounting apparatus comprising:
a component mounting unit configured to such and transport a component;
a first light source configured to emit first light to the component;
a second light source configured to emit second light to a Fiducial mark of a substrate;
a filter configured to transmit the first light reflected by the component through the filter, and reflect the second light reflected by the Fiducial mark;
an image capturer configured to detect the first light transmitted through the filter and the second light refracted by the filter, and
a casing that has a space therein that includes the filter,
wherein the first light source and the second light source emit the first light and the second light, respectively, away from the casing,
the casing comprises a first partition wall that is a first inner wall of the casing, the first partition wall configured to block the first light, reflected by the component, from directly entering the image capturer after the first light enters the casing, and
the casing further comprises a second partition wall that is a second inner wall of the casing, the second partition wall configured to block the second light, reflected by the Fiducial mark, from directly entering the image capturer after the second light enters the casing.

* * * * *